United States Patent
Wu et al.

(10) Patent No.: US 6,414,886 B2
(45) Date of Patent: Jul. 2, 2002

(54) INTEGRATED MEMORY WITH INTERBLOCK REDUNDANCY

(75) Inventors: Xiaofeng Wu, München; Andreas Täuber, Unterschleissheim, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/781,175

(22) Filed: Feb. 12, 2001

Related U.S. Application Data

(63) Continuation of application No. PCT/DE99/02401, filed on Aug. 2, 1999.

(30) Foreign Application Priority Data

Aug. 12, 1998 (DE) .......................................... 198 36 578

(51) Int. Cl.[7] ................................................. G11C 7/00
(52) U.S. Cl. ............. 365/200; 365/230.01; 365/230.03; 365/230.06
(58) Field of Search ........................... 365/200, 230.01, 365/230.03, 230.06

(56) References Cited

U.S. PATENT DOCUMENTS

| | | | | |
|---|---|---|---|---|
| 4,918,662 A | * | 4/1990 | Kondo ........................ 365/210 |
| 5,561,636 A | | 10/1996 | Kirihata et al. |
| 5,701,270 A | | 12/1997 | Rao |
| 5,798,973 A | * | 8/1998 | Isa .............................. 365/200 |
| 5,841,961 A | * | 11/1998 | Kozaru et al. ......... 395/182.03 |
| 5,903,575 A | * | 5/1999 | Kikuda ....................... 371/21.2 |
| 6,011,734 A | * | 1/2000 | Pappert ....................... 365/200 |
| 6,064,609 A | * | 5/2000 | Jung et al. .................. 365/200 |
| 6,144,592 A | * | 11/2000 | Kanda ......................... 365/200 |
| 6,178,124 B1 | * | 1/2001 | Kaiser et al. ............... 365/200 |
| 6,199,177 B1 | * | 3/2001 | Blodgett ......................... 714/7 |
| 6,252,809 B1 | * | 6/2001 | Kim ............................. 365/200 |
| 6,285,605 B1 | * | 9/2001 | Schrogmeier et al. ...... 365/200 |

FOREIGN PATENT DOCUMENTS

EP      0 636 258 B1     2/1995

* cited by examiner

Primary Examiner—Viet Q. Nguyen
(74) Attorney, Agent, or Firm—Laurence A. Greenberg; Werner H. Stemer; Ralph E. Locher

(57) ABSTRACT

An integrated memory is described that has memory blocks with column lines and row lines as well as at least one redundancy row line for replacing in each case one of the row lines in any of the memory blocks. In addition, each memory and memory block has a deactivation unit for deactivating the memory block. The integrated memory has deactivation lines, each of which is connected to an input of the deactivation unit of one of the memory blocks. Each memory block has a deactivation decoder that is connected at the output end to all the deactivation lines. If one of the row lines of a first memory block of the memory blocks is replaced by a redundancy row line of a second memory block of the memory blocks, the deactivation decoder of the second memory block deactivates the first memory block via the corresponding deactivation line.

5 Claims, 4 Drawing Sheets

INTEGRATED MEMORY WITH INTERBLOCK REDUNDANCY

CROSS-REFERENCE TO RELATED APPLICATION

This application is a continuation of copending International Application No. PCT/DE99/02401, filed Aug. 2, 1999, which designated the United States.

BACKGROUND OF THE INVENTION

Field of the Invention

The invention relates to an integrated memory with interblock redundancy.

An integrated memory with interblock redundancy is described in European Patent EP 0 636 258 B1. The memory is divided into a plurality of memory blocks that each contain bit lines and word lines as well as redundant word lines. The redundant word lines are used for replacing the normal word lines in address terms in the case of redundancy. If one of the normal word lines is defective, address replacement can be performed by carrying out redundancy programming. The redundant word lines in European Patent EP 0 636 258 B1 are not used to replace defective word lines in the same memory block ("intrablock redundancy") but rather to replace word lines in any one of the memory blocks. This is referred to as "interblock redundancy". In order to avoid short-circuits between the memory cells, it is necessary to ensure that at most one word line is activated at a given time per memory block. Since, in the case of interblock redundancy, the block from which the replacing redundant word line will originate is not defined in advance, the European Patent EP 0 636 258 B1 provides that at most one of the memory blocks of the interblock redundancy area can be activated at a given time. The memory has a deactivation line via which all the memory blocks of the interblock redundancy area can be deactivated by an inhibit signal. The memory block that has been defined as the one in which one of the redundant word lines will be activated is exempted from this deactivation. This memory block generates the inhibit signal.

The prior art described has the disadvantage that in each case just one memory block can ever be activated at a given time within the interblock redundancy area.

SUMMARY OF THE INVENTION

It is accordingly an object of the invention to provide an integrated memory with interblock redundancy which overcomes the above-mentioned disadvantages of the prior art devices of this general type.

With the foregoing and other objects in view there is provided, in accordance with the invention, an integrated memory. The memory contains deactivation lines and memory blocks including a first memory block and a second memory block. Each of the memory blocks contains row lines, column lines intersecting the row lines at intersection points, memory cells disposed at the intersection points of the column lines and the row lines, and at least one redundancy row line for replacing, in each case, one of the row lines in any of the memory blocks and intersecting the row lines. A deactivation unit for deactivating a respective memory block and having an input and an output is provided, the input is connected to one of the deactivation lines. A deactivation decoder is provided and has an output end connected to the deactivation lines assigned to other ones of the memory blocks. If one of the row lines of the first memory block of the memory blocks is replaced by the redundancy row line of the second memory block of the memory blocks, the deactivation decoder of the second memory block deactivates the first memory block through a corresponding one of the deactivation lines.

The integrated memory according to the invention has memory blocks with deactivation units for deactivating them. In addition, it has, for each memory block, a deactivation line which is respectively connected to an input of its deactivation unit. Each memory block has a deactivation decoder that is connected at the output end to the deactivation lines assigned to the other memory blocks. When one of the row lines of a first memory block of the memory blocks is replaced by a redundancy row line of a second memory block of the memory blocks, the deactivation decoder of the second memory block deactivates the first memory block via the corresponding deactivation line.

In the invention, when there is redundancy, only that memory block whose row line is to be respectively replaced is deactivated via the appropriate deactivation line. In contrast, in European Patent EP 0 636 258 B1, in the case of redundancy all the memory blocks are deactivated with the exception of that memory block which has the redundant row line. In European Patent EP 0 636 258 B1, the simultaneous deactivation of all the memory blocks takes place via just one common deactivation line. In the invention, a deactivation line is assigned to each memory block.

According to a first embodiment of the invention, the column lines are bit lines and the row lines are word lines. There is then interblock redundancy with respect to the word lines. According to another embodiment of the invention, the column lines are word lines and the row lines are bit lines of the memory, so that there is then interblock redundancy with respect to the bit lines.

The invention is particularly advantageous if the integrated memory contains memory blocks, of which more than one can be activated simultaneously. If, for example, in each case two of the memory blocks of the interblock redundancy area could be activated simultaneously, in the procedure according to European Patent EP 0 636 258 B1 all the other memory blocks would be deactivated by the memory block with the replacing redundant line in the case of redundancy. In contrast, according to the invention, on the basis of the redundancy activated, just that memory block whose row line is to be replaced by the redundant line is ever deactivated via its deactivation line by the corresponding memory block. Given two memory blocks that are to be activated simultaneously, the activation of the one memory block therefore remains unaffected if a row line is replaced in the other memory block by a redundant row line of a third memory block. Of course, it is also unproblematic if defective row lines in the two memory blocks which are to be activated simultaneously are to be replaced at the same time by redundant row lines in other, respectively different memory blocks of the interblock redundancy area. The memory block with the replacing redundant row line deactivates in each case the associated memory block with the normal row line which is to be replaced. The number of memory blocks that can be activated simultaneously therefore always remains constant, even in the case of redundancy.

According to one embodiment of the invention, the integrated memory has an address bus connected to the memory blocks, for transmitting block addresses and row addresses. The memory blocks each have at least one redundancy memory unit for storing the block address and the row address of one of the row lines which is to be replaced by the redundancy row line of this memory block. In addition, the memory blocks have, for each redundancy memory unit, in each case one comparator unit for comparing the address transmitted via the address bus with the address stored in the corresponding redundancy memory unit, which, given correspondence, activates a corresponding result signal at a result output. The deactivation decoders of the memory blocks have inputs that are connected to the associated redundancy memory unit for supplying the block address of the row line which is to be respectively replaced, and a further input which is connected to the result output of the comparator unit of the corresponding memory block. If the corresponding result signal is activated, the deactivation decoders deactivate via the corresponding deactivation line that memory block whose block address is supplied to them from the redundancy memory unit.

According to one development of the invention, the block addresses are encoded with n address bits. At the same time, in each case at least two of the memory blocks can be addressed using common block group addresses which are encoded with m <n address bits which are parts of the block addresses. The redundancy memory units in turn store the block address and the row address of the row line which is to be respectively replaced. The comparator units compare the address stored in the associated redundancy memory unit with the block group address present on the address bus and the row address. The inputs of the deactivation decoders are supplied by the redundancy memory units with the complete block address of that memory block whose row line is to be replaced.

This development of the invention is concerned with the previously described case in which more than one of the memory blocks of the interblock redundancy area can be activated simultaneously. Since the memory blocks which are to be activated simultaneously can be addressed via a common block group address, the width of the address bus is reduced, because only a relatively small number m of address bits have to be transmitted to the memory blocks instead of the n address bits of the complete block addresses. Furthermore, the comparator units can be of simpler construction because they only have to compare the relatively small number of m block group address bits. However, the deactivation decoders are supplied not only with the block group address which is transmitted via the address bus but also with the complete block address of the row line which is to be respectively replaced, the block address being stored in the redundancy memory unit. Therefore, just one deactivation of that memory block of the memory blocks to be activated simultaneously which is to be replaced by the redundant row line is carried out via the corresponding deactivation line. Consequently, in the case of redundancy, all of the memory blocks of the block group are not deactivated.

Other features which are considered as characteristic for the invention are set forth in the appended claims.

Although the invention is illustrated and described herein as embodied in an integrated memory with interblock redundancy, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
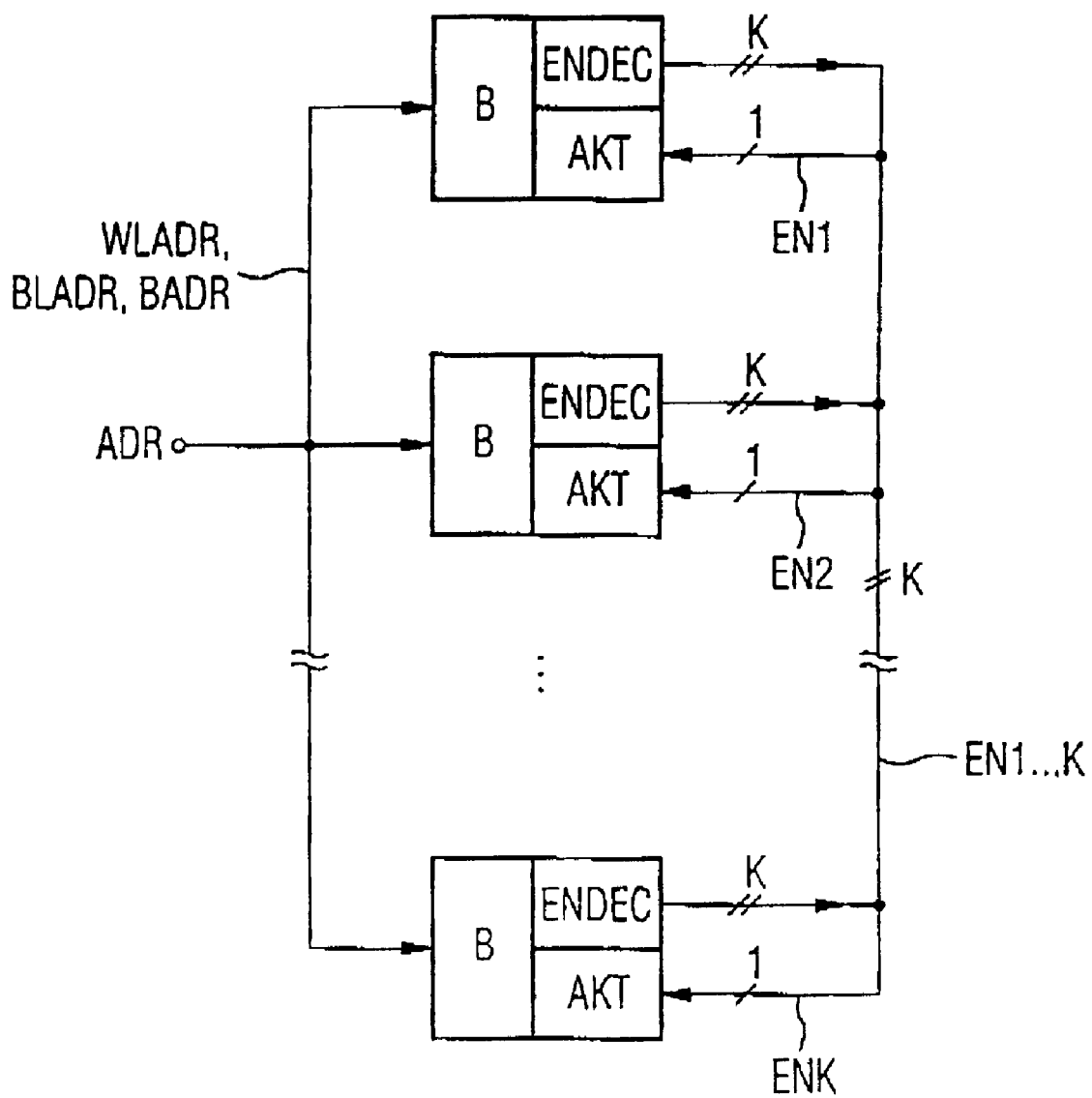
FIG. 1 is a block circuit diagram of an exemplary embodiment of an integrated memory with k memory blocks according to the invention.

DESCRIPTION OF THE PREFERRED EMBODIMENTS:

In all the figures of the drawing, sub-features and integral parts that correspond to one another bear the same reference symbol in each case. Referring now to the figures of the drawing in detail and first, particularly, to FIG. 1 thereof, there is shown an integrated memory with an address bus ADR, k memory blocks B (of which only three are illustrated in FIG. 1) and deactivation lines En1 . . . k. Each of the memory blocks B has a deactivation unit AKT with an input which is connected to, in each case, one of the deactivation lines EN1 . . . k. Row addresses WLADR, column addresses BLADR and block addresses BADR are transmitted to the memory blocks B via the address bus ADR. This will be explained in more detail with reference to FIG. 2. In addition, each memory block B in FIG. 1 has a deactivation decoder ENDEC whose outputs are connected to all the deactivation lines EN1 . . . k. In other exemplary embodiments of the invention, the deactivation decoders ENDEC can also be connected only to k−1 deactivation lines of the respective other memory blocks B.

The function of the deactivation lines EN1 . . . k is as follows: in the case of redundancy, one of the memory blocks B which contains a redundant row line RWL for replacing the defective row line WL of another memory block deactivates, via the corresponding deactivation line EN1 . . . k, the memory block B with the defective row line which is to be replaced.

Figure 2:
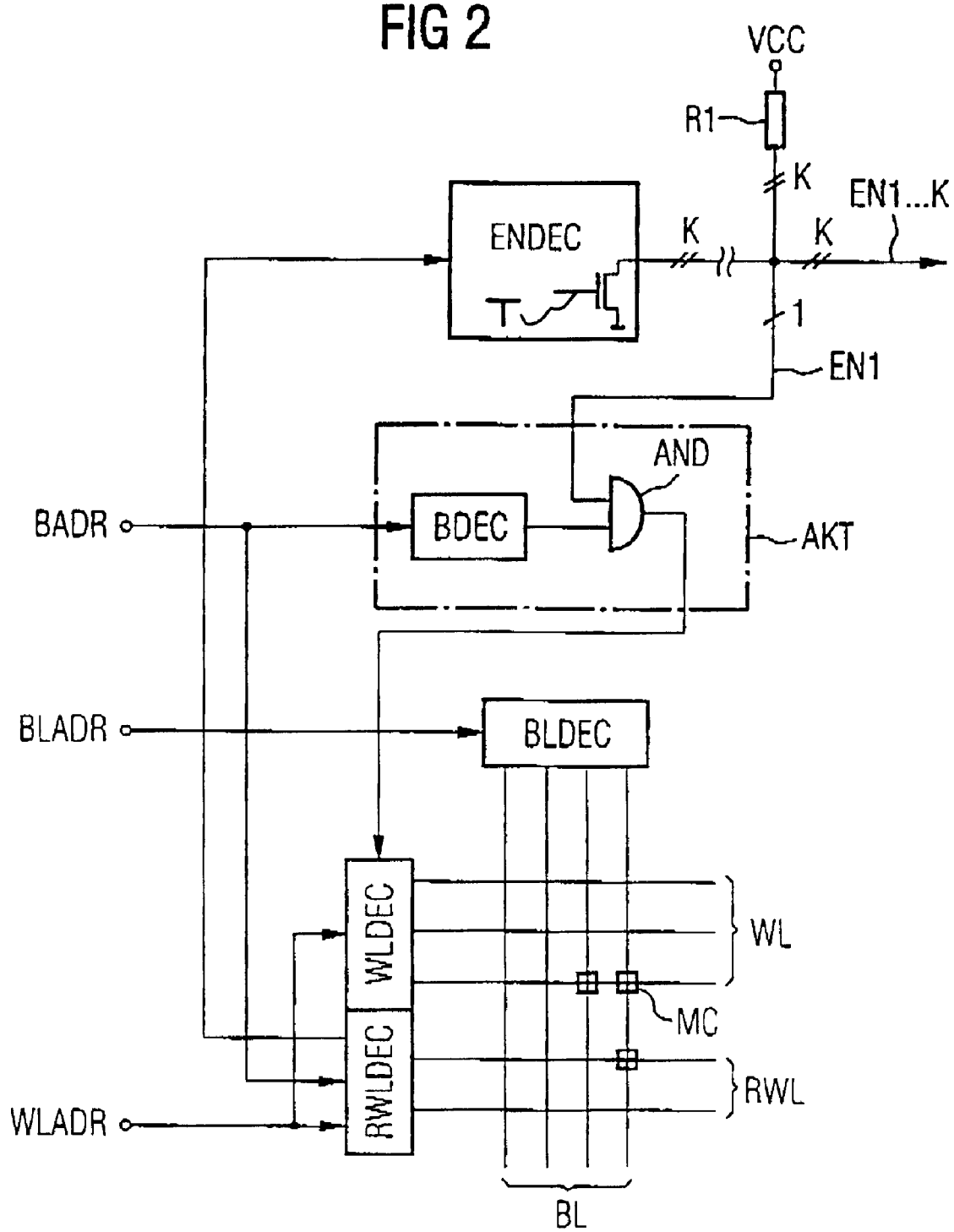
FIG. 2 is a block diagram of a memory block shown in FIG. 1.

The method of operation of a first exemplary embodiment of the invention will be explained in more detail with reference to FIGS. 2 and 3. FIG. 2 shows one of the memory blocks B from FIG. 1. The memory block B has row lines WL and redundant row lines RWL as well as column lines BL. There are memory cells MC of the integrated memory at points of intersection of the row lines WL or the redundant row lines RWL with the column lines BL. The invention can be applied to any desired integrated memory that is organized as row lines and column lines, that is to say has a matrix structure. In the present case, the row lines WL and the redundant row lines RWL are word lines of the memory, and the column lines BL are bit lines. This is therefore a case of word line redundancy. However, the invention can equally well be applied to bit line redundancy. The row lines WL are then bit lines, and the column lines BL are then word lines of the memory.

The address signals that are supplied to the memory block B via the address bus ADR from FIG. 1 are illustrated in the left-hand part of FIG. 2. The column addresses BLADR are thus supplied to a column decoder BLDEC by which the column lines BL can be selected. In the same way, the row addresses WLADR are supplied to a row decoder WLDEC for activating one of the row lines WL, and to a redundant row decoder RWLDEC for activating one of the redundant row lines RWL. The memory block B also has a block decoder BDEC to which the block addresses BADR are supplied via the address bus ADR. If the respective block address BADR of the memory block B is present at the block decoder BDEC, the latter activates, via its output, the row decoder WLDEC to which it is connected via an AND gate AND. However, this takes place only if there is a high level (logic "1") present at a second input of the AND gate. This second input is connected to the deactivation line EN1 that is assigned to the memory block B. By this line, the memory block B can be deactivated, in the case of redundancy, by another memory block in which a redundant row line RWL is selected. Further details are given below of the circuitry of the second input of the AND gate.

The memory block in FIG. 2 also has the deactivation decoder ENDEC with inputs that are connected to outputs of the redundant row decoder RWLDEC. Outputs of the deactivation decoder ENDEC are connected to the k deactivation lines EN1 . . . k of the k memory blocks B of the integrated memory. The outputs of the deactivation decoder ENDEC are open drain outputs with one transistor T each. With, in each case, one pull-up resistor R1, the deactivation lines are pulled to a high potential if none of the transistors T connected to the line is switched on. All the memory blocks B of this exemplary embodiment are implemented as shown in FIG. 2. For this reason, the outputting of a logic "0" by switching on the corresponding transistor T is dominant and determines the potential of the corresponding deactivation line, even if all the other memory blocks B output a logic "0" onto this deactivation line via their open drain outputs, i.e. switch off their corresponding output transistors T.

Figure 3:
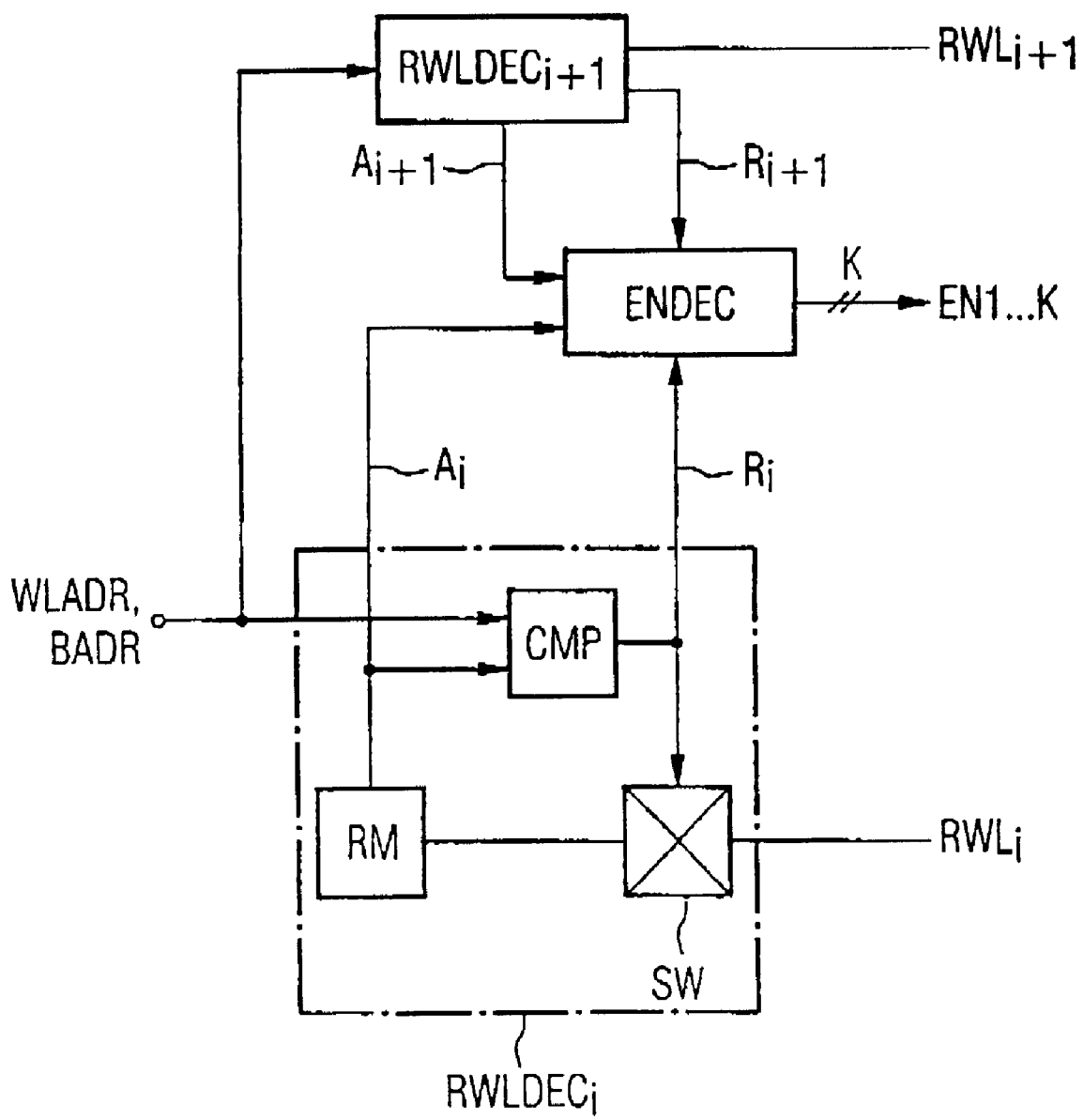
FIG. 3 is a block diagram of the memory block shown in FIG. 2, relating to a redundant row decoder and its connection to a deactivation decoder.

FIG. 3 shows further details of the first exemplary embodiment of the memory block B from FIG. 2. The redundant row decoder RWLDEC has a plurality of components RWLDECi, i+1 . . . that are all of the same configuration. In FIG. 3, just two of these components are illustrated, one of which is represented in more detail in the lower part of FIG. 3. Each of these components is assigned to one of the redundant row lines RWL. It has a redundancy memory unit RM which contains programmable elements (for example laser fuses) which are used to store information indicating which row line WL of which memory block B is to be replaced by the corresponding redundant row line RWLi. In addition, each component RWLDECI of the redundant row decoder RWLDEC has a comparator unit CMP which compares the address stored in the redundancy memory unit RM with the block address BADR respectively present on the address bus ADR and the row address WADR. The comparator unit CMP generates, at a result output, a result signal Ri that has a different level if the two addresses to be compared do not correspond than if they do correspond. If the address stored in the redundancy memory unit RM corresponds to the address present on the address bus ADR, the result signal Ri is subsequently referred to as being "activated" by the comparator unit CMP.

The result signal Ri is supplied to a switching element SW by which the redundancy memory unit RM selects the appropriate redundant row line RWLi if the result signal Ri is activated. This is the case if the comparator unit CMP has detected the presence of an address (row address and block address) of the row line WL to be replaced on the address bus ADR (case of redundancy).

The result signal Ri of all the components RWLDECi of the memory block B is, on the other hand, supplied to its deactivation decoder ENDEC. In addition, the block address Ai of the row line WL to be replaced, the block address Ai being stored in each redundancy memory unit RM of the memory block B, is supplied to the deactivation decoder ENDEC. The method of operation of the deactivation decoder ENDEC is as follows. If none of the result signals Ri is activated, the deactivation decoder ENDEC is deactivated, so that it switches off its output transistors T. If one of the result signals Ri is, on the other hand, activated (with redundancy detected by the corresponding comparator unit CMP), the deactivation decoder ENDEC is activated and pulls to a low level (logic "0") that deactivation line of the deactivation lines EN1 . . . k which is assigned to the memory block to which the block address Ai stored in the redundancy memory unit RM corresponds. This is effected by switching on the corresponding output transistor T. When the result signal Ri of the component RWLDECi is activated, the deactivation decoder ENDEC therefore decodes the associated block address Ai stored in the corresponding redundancy memory unit RM.

The second input of the AND gate AND in FIG. 2 is connected to the deactivation line EN1 assigned to the respective memory block B. If the deactivation line EN1 is not placed at a low level by any of the deactivation decoders ENDEC of all the memory blocks, the output signal of the AND gate AND is determined only by the output signal of the block decoder BDEC. If, on the other hand, the deactivation line EN1 has a low level because one of the deactivation decoders ENDEC has determined that one of the row lines WL of this block is to be replaced by one of its redundant row lines RWL, the output signal of the AND gate AND has a low level, irrespective of the output signal of the block decoder BDEC. Since the row decoder WLDEC is activated at a high level of the output signal of the AND gate AND and deactivated at a low level, the respective memory block is therefore deactivated via the deactivation lines EN1 . . . k. The block decoder BDEC and the AND gate AND in FIG. 2 form the deactivation unit AKT in FIG. 1.

Figure 4:
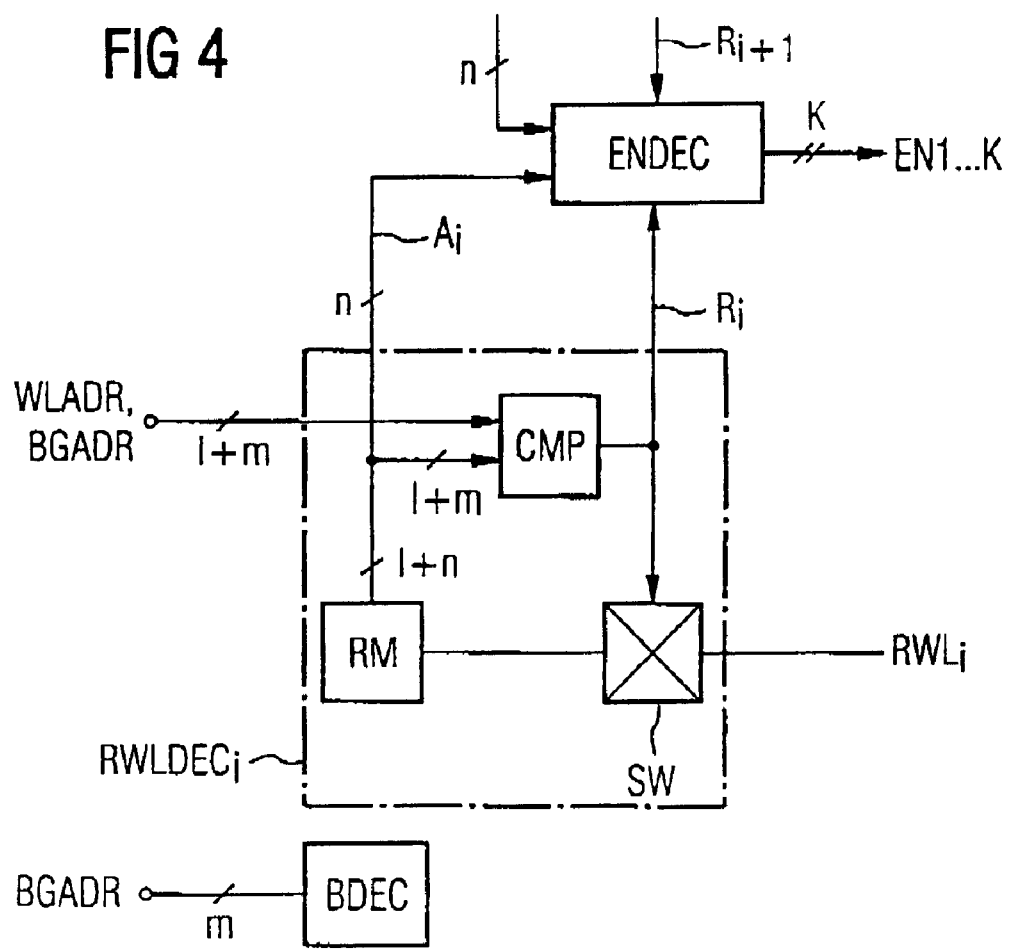
FIG. 4 is a block diagram of a second embodiment of the memory block shown in FIG. 2.

FIG. 4 shows a refinement of the exemplary embodiment of the memory block in FIG. 3. Integrated memories with the memory block B according to FIG. 4 are suitable for simultaneously activating a plurality of the memory blocks of the interblock redundancy area. The components RWLDECI of the redundant row decoders RWLDEC in FIG. 4 each have in turn one redundancy memory unit RM in which the complete block address Ai and the row address of the row line WL to be replaced is stored. In this exemplary embodiment, in each case one common block group address BGADR is assigned to a plurality of the memory blocks B. While each block address BADR has n address bits, each block group address BGADR has m<n address bits.

Figure 5:
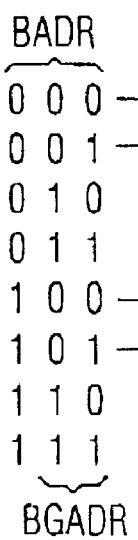
FIG. 5 is an illustration showing a relationship between block addresses and block group addresses for the exemplary embodiment shown in FIG. 4.

The relationship between the block address BADR and block group addresses BGADR is illustrated in FIG. 5. In the present case, the interblock redundancy area of the integrated memory has k=8 memory blocks which are encoded using block addresses BADR with n=3 address bits. The two low order bits of the block address BADR form the block group address BGADR with m=2 address bits. In each case two of the memory blocks B in which these address bits correspond, which therefore have the same block group address BGADR, are addressed simultaneously by the two low order bits of the block address BADR.

FIG. 4 shows that only the m address bits of the block group address BGADR are supplied to the block decoder BDEC of the memory block B. Apart from the current row address WLADR, which has one bit, only the current block group address BGADR with m bits is also supplied to the comparator unit CMP. In comparison to the exemplary embodiment in FIG. 3, the block decoder BDEC and the comparator unit CMP can therefore be implemented in the exemplary embodiment according to FIG. 4 with fewer components because only the block group addresses BGADR with m bits are compared, and not the complete block addresses BADR with n bits. However, the deactivation decoder ENDEC in FIG. 4 is supplied, like that in FIG. 3, with the entire block address Ai with its n address bits by the redundancy memory unit RM. As a result, when the stored block address Ai is decoded by the deactivation decoder ENDEC, only one of the deactivation lines EN1 . . . k is selected. It is important that in each case the deactivation decoder ENDEC pulls just one of the deactivation lines EN1 . . . k to a low potential so that a plurality of memory blocks B of a block group are not deactivated simultaneously.

We claim:

1. An integrated memory, comprising:

deactivation lines; and memory blocks including a first memory block and a second memory block, each of said memory blocks containing:

row lines;

column lines intersecting said row lines at intersection point;

memory cells disposed at said intersection points of said column lines and said row lines;

at least one redundancy row line for replacing and intersection a respective one of said row lines;

a deactivation unit for deactivating said first memory block and having an input and an output, said input connected to one of said deactivation lines; and a deactivation decoder having an output end connected to said deactivation lines assigned to said second memory block, if one of said row lines of said first memory block of said memory blocks is replaced by said redundancy row line of said second memory block of said memory blocks, said deactivation decoder deactivates said first memory block through a corresponding one of said deactivation lines.

2. The integrated memory according to claim 1, including an address bus connected to said memory blocks, said address bus transmitting block addresses and row addresses;

wherein said memory blocks each have at least one redundancy memory unit for storing a block address and a row address of one of said row lines which is to replaced by said redundancy row line of one of said memory blocks;

wherein said memory blocks each have a comparator unit connected to said redundancy memory unit, said comparator unit having a result output and compares an address transmitted through said address bus with the address stored in said redundancy memory unit, which, given correspondence, generates a result signal available at said result output; and wherein said deactivation decoder having a first input connected to said redundancy memory unit for supplying the block address of said row line which is to be replaced, and a second input connected to said result output of said comparator unit, and, if the result signal is activated, said deactivation decoder deactivates, through a corresponding one of said deactivation lines a respective one of said memory blocks whose block address is supplied to it from said redundancy memory unit.

3. The integrated memory according to claim 2, wherein the block address is encoded with n address bits;

at least two of said memory blocks can be addressed using common block group addresses which are encoded with m<n of the address bits which are parts of the block address;

said comparator unit compares the address stored in said redundancy memory unit with the common block group address present on the address bus and the row address; and said deactivation decoder is supplied with the block address of said respective one of said memory blocks whose row line is to be replaced.

4. The integrated memory according to claim 1, wherein said column lines are bit lines, and said row lines are word lines.

5. The integrated memory according to claim 1, wherein said column lines are word lines and said row lines are bit lines.

* * * * *